VHF TUNER FOR TELEVISION RECEIVER

Original Filed May 5, 1965

INVENTORS:
EUGENE K. VON FANGE,
ALBERT P. WEINER,

BY William S. Wolfe
THEIR ATTORNEY.

United States Patent Office 3,365,621
Patented Jan. 23, 1968

3,365,621

VHF TUNER FOR TELEVISION RECEIVER

Eugene K. Von Fange, Syracuse, and Albert P. Weiner, North Syracuse, N.Y., assignors to General Electric Company, a corporation of New York Continuation of application Ser. No. 452,721, May 3, 1965. This application Mar. 7, 1967, Ser. No. 621,354
7 Claims. (Cl. 317—101)

Figures 1, 2, 3, 4, 5:
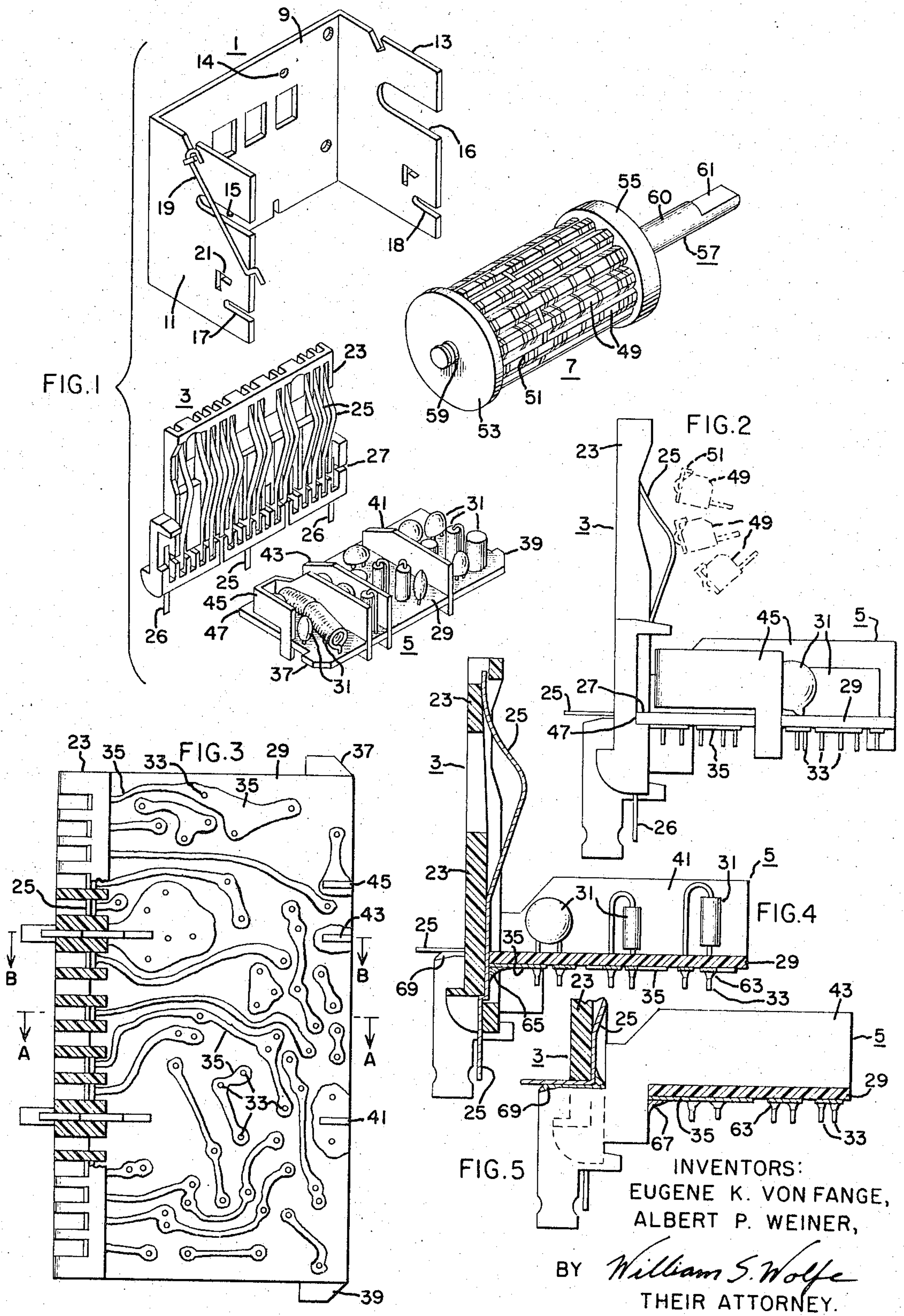

This is a continuation of application Ser. No. 452,721 filed May 3, 1965, now abandoned.

The present invention relates to television receivers and more specifically to an improved VHF tuner for such receivers.

The turret type tuner finds wide-spread application in television receivers. Such tuners generally comprise a rotatable turret including thirteen circularly arrayed tuner strips, one tuner strip being provided for each VHF channel and one for UHF operation. Each tuner strip includes a plurality of tuning coils positioned thereon and further includes a plurality of contacts associated with the tuning coils and extending outwardly of the array. The turret is rotatably positioned within a frame in such a manner as to allow selective indexing of each of the tuner strips to an operating position for selection of a desired channel. A plurality of fixed switch contacts are utilized to make electrical connection between the contacts of the selected tuner strip and the associated circuit elements of the tuner. In this manner the tuning coils of the selected strip are connected to the tuner circuitry to perform the desired tuning operation.

Prior art tuners of the above-described type have employed a number of structures for the mounting and interconnecting of the various components. However, the prior art structures in general exhibit a number of disadvantages. In particular, the prior art structures are not compatible with miniaturized tuners and the size limitations imposed thereby.

In one prior art structure, the circuit elements are mounted directly to the frame of the tuner, hand wiring being necessary to interconnect the various circuit elements and the fixed switch contacts. The hand wiring required by such a sturcture is inherently time-consuming and thus expensive. In addition, such a structure requires the mounting of various electrical terminations such as feed throughs, sockets and terminal boards to the frame. A structure of this nature becomes completely impractical with respect to miniaturized tuners.

In further prior art structures the various circuit elements are mounted to one or more circuit boards of the type having wiring printed or etched thereon, the elements being assembled to the circuit boards by a soldering operation. Subsequently, the circuit boards are mounted to the frame, hand wiring and additional soldering operations being necessary to provide the necessary connection between the circuit elements and the switch contacts. Structures of this type are both complex and expensive and involve a relatively large number of fabrication operations. Again, such structures are not completely suitable for use in miniaturized tuners.

The present invention presents an improved structure for a VHF tuner which overcomes the prior art problems.

Thus, an object of the invention is to provide an improved miniaturized VHF tuner.

Yet, another object is to provide an improved VHF tuner which is less complex than prior art structures and which utilizes a minimum number of structural elements.

Still another object is to provide a VHF tuner which requires a minimum number of fabrication operations.

Another object is to provide an improved VHF tuner which is less expensive than prior art tuners.

A further object is to provide a VHF tuner which eliminates the necessity for hand wiring.

These and other objects are achieved in one embodiment of the invention through the use of a sub-assembly comprising a circuit board having wiring formed thereon and bearing the various circuit elements and shielding members and an insulative member bearing the fixed switch contacts and various terminals. The circuit board is inserted into a slot in the insulative member, the sub-assembly thus formed being dip soldered in a single operation to solder the various circuit elements, shielding members, terminals and the switch contacts to the circuit board. The sub-assembly thus becomes an integral unit which is readily inserted into a frame unit in the proper relationship to the associated rotatable turret and with the shielding members providing the necessary low inductance ground paths from the circuit board to the frame unit.

The novel and distinctive features of the invention are set forth in the appended claims. The invention itself, together with further objects and advantages thereof, may best be understood by reference to the following description and accompanying drawings in which:

FIGURE 1 is an exploded perspective view of a VHF tuner in accordance with the invention, FIGURE 2 is an end view of the stator block and circuit board sub-assembly depicted in FIGURE 1, FIGURE 3 is a bottom view of the sub-assembly depicted in FIGURE 2, FIGURE 4 is a sectional view taken along the line A—A of FIGURE 3, and FIGURE 5 is a partial sectional view taken along the line B—B of FIGURE 3.

Referring to FIGURE 1, there is shown an exploded perspective view of the VHF tuner of the invention. The tuner comprises a frame unit generally shown at 1, a stator block unit generally shown at 3, a printed circuit unit generally shown at 5, and a rotatable turret unit generally shown at 7. The term "printed circuitry" as used throughout this specification refers generally to a circuit having conductive paths formed thereon by any suitable method such as for example by printing or etching. In accordance with the invention the stator block unit 3 and printed circuit unit 5 comprise a sub-assembly of the tuner.

The frame unit 1 comprises a deck portion 9 and a pair of integral upturned end portions 11 and 13. The deck portion 9 is provided with a plurality of apertures 14 adapted to receive screws for mounting the sub-assembly comprising stator block unit 3 and printed circuit unit 5 to the frame unit 1. The end portions 11 and 13 are provided with a pair of slots 15 and 16 respectively for rotatably receiving the turret assembly 7. A second pair of slots 17 and 18 are provided in the end portions 11 and 13 respectively for receiving the printed circuit unit 5. A spring retainer 19 is utilized to retain the turret assembly 7 in the slot 15, the end of the spring retainer 19 being lockedly received by an aperture 21 in end portion 11 to retain the turret assembly 7 in the desired position. A similar spring retainer (not shown) is positioned on the end portion 13.

The stator block unit 3 comprises an insulative member 23 and a plurality of spring contacts 25. The spring contacts 25 are assembled to the insulative member 23 as described and claimed in the co-pending application of David J. Hale, Ser. No. 443,797, filed Mar. 30, 1965 and assigned to the assignee of the present invention. Similarly, various terminals 26 are assembled to the insulative member 23 to provide for external connections, certain of the spring contacts 25 being extended to themselves serve as terminals as described in the co-pending application. The insulative member 23 is provided with a slot 27 extending along the length thereof, the slot 27 being adapted to receive the printed circuit unit 5 to form a sub-assembly in accordance with the invention.

The printed circuit unit 5 comprises a printed circuit board 29 as more clearly shown in FIGURE 3. Various circuit elements 31 comprising the tuner circuitry are assembled to the board 29, the leads 33 of the various circuit elements being received by suitable apertures in the board 29 for connection to the printed circuitry 35 as shown in FIGURE 3. The printed circuit board 29 is further provided with a pair of tabs 37 and 39 adapted to be received by the slots 17 and 18 respectively of the frame unit 1 to assist in mounting the sub-assembly comprising stator block unit 3 and printed circuit unit 5 thereto. A number of shielding members 41, 43, and 45 also are connected to the printed circuit board, these members serving to isolate the various portions of the tuner circuitry and to provide low inductance ground paths from the printed circuit board to the frame unit.

In accordance with the invention, the bottom edge 47 of the printed circuit board 29 is adapted to be received by the slot 27 of the insulative member 23 to form the aforementioned sub-assembly.

The rotatable turret unit 7 comprises a circular array of thirteen tuner strips 49, twelve strips being employed for VHF operation and one strip for UHF operation. The tuner strips are provided with a plurality of outwardly extending contacts 51, the contacts for the various tuner strips being aligned around the circumference of the array. The tuner strips 49 are positioned between a pair of end support members 53 and 55, a shaft 57 attached to the support members extending through the array. The end 59 of shaft 57 is circumferentially slotted in such a manner that the end portion 59 is adapted to be received by the slot 15 of frame assembly 1, the groove at end portion 59 serving to restrain axial motion of the turret assembly 7. The opposite end 60 of the shaft 57 is provided with a key portion 61 adapted to engage a conventional tuning knob (not shown). The end 60 of shaft 57 is adapted to be rotatably received by the slot 16 of the frame unit 1.

Referring to FIGURE 2, there is shown an end view of the unsoldered sub-assembly comprising stator block unit 3 and printed circuit unit 5 depicted in FIGURE 1. A portion of the rotatable turret unit 7 including tuner strips 49 and contacts 51 is depicted in dotted lines to indicate the relationship of the rotatable turret unit 7 to the sub-assembly when the sub-assembly is assembled to the frame 1. As depicted, the rotatable turret can be selectively indexed to bring a particular contact 51 into contact with the fixed contact 25 to thereby connect the appropriate tuning coils in the tuner circuitry.

In accordance with the invention, the sub-assembly is formed by inserting the edge 47 of the printed circuit board 29 bearing the circuit elements 31 and shielding members 41, 43 and 45 into the slot 27 of the insulative member 23. The printed circuit board 29 is thus positioned generally perpendicular to the insulative member 23. In this position the spring contacts 25 and the terminals 26 are sandwiched between the edge of the printed circuit board 29 and the insulative member 23, thereby eliminating the necessity for rigidly affixing the spring contacts and terminals to the insulative member. The sub-assembly is positioned in a suitable jig to maintain the printed circuit unit 5 in the desired relationship to the stator board unit 3 prior to the subsequent single dip soldering operation.

Referring to FIGURE 3 there is shown a bottom view of the sub-assembly depicted in FIGURE 2. As depicted, the leads 33 of the circuit elements 31 extend through the board in proximity to the printed circuitry 35 to effect, when soldered, electrical connection therebetween. The printed circuitry 35 is extended to the edge of the printed circuit board 29 to contact the various spring contacts 25 and terminals 26 thus effecting mechanical and electrical connection, when soldered, between the circuit elements 31 and the spring contacts and terminals. Additionally, the various shields 41, 43 and 45 contact appropriate portions of the printed circuitry 35 and are mechanically and electrically connected thereto by the subsequent single soldering operation.

The unsoldered sub-assembly as shown in FIGURES 2 and 3 is dip solderable by a single soldering operation to produce an integral sub-assembly as shown more clearly in FIGURE 4. FIGURE 4 depicts a cross-sectional view of the sub-assembly taken along the line A—A of FIGURE 3. This figure indicates the manner in which the circuit elements 31, the spring contacts 25, the terminals 26 and the shielding members 41, 43 and 45 are soldered to the circuit board 29 to form an integral assembly by a single dip soldering operation.

When the sub-assembly oriented as shown in FIGURE 4 a dip solder operation is performed to form solder joints 63 between the various leads 33 of the circuit elements and the associated printed circuitry 35. Additionally, solder joints 65 are effected between the printed circuitry 35 and the various spring contacts 25 and terminals 26 by the same dip soldering operation. Still further, the dip soldering operation effects a solder joint between the various shielding members 41, 43 and 45, the printed circuitry 35, the associated spring contacts 25 and the associated terminals 26.

Referring to FIGURE 5, there is shown a partial cross-sectional view taken along the line B—B of FIGURE 3 depicting the manner in which one of the shielding members 43 is soldered to the printed circuitry 35 and a spring contact 25 having a down turned end portion to facilitate connection to the shielding member. As depicted, a solder joint 67 connects the printed circuitry 35 to the shielding member 43. Similar solder joints (not shown) are effected by the same operation for connection of the shielding members 41 and 45. Additionally, solder joints 69 are effected between the downturned end portion of the spring contact 25 and the shielding member 43.

The soldered sub-assembly as depicted in FIGURES 4 and 5 becomes an integral unit due to the solder joints effected between the stator block unit 3 and the printed circuit unit 5. In accordance with the invention, the sub-assembly thus formed is inserted in the frame unit 1 as shown in FIGURE 1, the insulative member 23 being positioned on the deck portion 9 of the frame unit 1 and suitable screws being inserted through the apertures 14 into the insulative member 23. With the insulative member thus mounted, the ears 37 and 39 of the printed circuit board 29 are received by the slots 17 and 18 respectively of the frame unit. The ears 37 and 39 assist in the mounting and positioning of the sub-assembly, a solder joint being effected between printed circuit material on the ears 37 and 39 and the ends 11 and 13 of the frame unit. With the sub-assembly thus mounted the rotatable turret unit 7 is inserted in the slots 15 and 16, the contacts 51 of the turret assembly 7 automatically aligning with the appropriate spring contact 25. With the tuner thus assembled, the shielding members 41 and 43 may be soldered to the deck 9 of the frame unit 1 to provide a high degree of shielding and the necessary low inductance ground path between the printed circuitry and the frame unit.

Thus, in accordance with the invention, a sub-assembly is provided comprising the stator block unit 3 and the printed circuit unit 5 which are mechanically and electrically connected through a single dip solder operation to form an integral sub-assembly. The sub-assembly thus formed is then readily assembled to the frame unit 1 in the desired relationship to the rotatable turret unit 7, the terminals 26 and certain of the spring contacts 25 providing for all necessary external connections to the tuner.

Although the invention has been described with respect to certain specific embodiments, it will be appreciated that modifications and changes may be made by those skilled in the art without departing from the spirit and scope of the invention.

What is claimed and desired to be secured by Letters Patent of the United States is:

1. A sub-assembly for a VHF tuner, said sub-assembly comprising:

(a) a stator block unit including an insulative member having a plurality of elongated spring contacts on one surface thereof;

(b) a printed circuit unit comprising a circuit board having a first surface and a second surface, said printed circuit unit further comprising a plurality of circuit elements having leads associated therewith and a plurality of conductive paths, said plurality of circuit elements consisting of all of the circuit elements of said printed circuit unit and positioned on said first surface with said leads extending to said second surface, said plurality of conductive paths positioned on said second surface, said circuit board being positioned in abutment with said insulative member in generally perpendicular relationship thereto;

(c) and a first plurality of soldered joints at said second surface between said spring contacts and said conductive paths and a second plurality of soldered joints at said second surface between said leads and said conductive paths to mechanically and electrically integrate said sub-assembly.

2. The sub-assembly as recited in claim 1 wherein said circuit board includes a plurality of apertures therein with said leads extending therethrough.

3. The sub-assembly as recited in claim 2 wherein said insulative member is provided with a slot therein adjacent said first plurality of soldered joints, said circuit board including an edge received in the slot to position said circuit board generally perpendicular to said insulative member with said spring contacts sandwiched between said circuit board and said insulative member.

4. The sub-assembly as recited in claim 3 including a shielding means and a first soldered joint, said circuit board having a slot therein, said shielding means inserted in the slot and intersecting said first surface and said second surface with said first solder joint positioned at said second surface between said shielding means and one of said plurality of conductive paths.

5. The sub-assembly as recited in claim 4 including a second soldered joint and a downturned end portion on one of said plurality of spring contacts substantially parallel to said second surface, said soldered joint connecting said shielding means and said downturned end portion.

6. The sub-assembly as recited in claim 4 wherein said shielding means comprises a plurality of shielding members.

7. The sub-assembly as recited in claim 5 wherein said shielding means comprises a plurality of shielding members.

References Cited

UNITED STATES PATENTS

| | | | |
|---|---|---|---|
| 2,695,963 | 11/1954 | Thias | 334—49 |
| 2,718,623 | 9/1955 | Yoder et al. | 334—49 X |
| 2,894,241 | 7/1959 | McKee | 339—17 |
| 2,898,563 | 8/1959 | De Cola et al. | 334—50 X |
| 2,910,628 | 10/1959 | Keener | 339—17 X |

HERMAN KARL SAALBACH, *Primary Examiner.*

ELI LIEBERMAN, *Examiner.*

R. F. HUNT, L. ALLAHUT, *Assistant Examiners.*